US012507376B2

(12) United States Patent
Hibbard et al.

(10) Patent No.: US 12,507,376 B2
(45) Date of Patent: Dec. 23, 2025

(54) COLD PLATE FOR POWER ELECTRONIC SYSTEMS

(71) Applicant: Ford Global Technologies, LLC, Dearborn, MI (US)

(72) Inventors: Michael Hibbard, Long Beach, CA (US); Areg Parlakyan, Tujunga, CA (US); Gary Randall, Rancho Palos Verdes, CA (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 18/764,142

(22) Filed: Jul. 3, 2024

(65) Prior Publication Data

US 2024/0365505 A1 Oct. 31, 2024

Related U.S. Application Data

(63) Continuation of application No. 18/143,973, filed on May 5, 2023, now Pat. No. 12,058,838, which is a continuation of application No. 17/864,865, filed on Jul. 14, 2022, now Pat. No. 11,659,684.

(60) Provisional application No. 63/222,802, filed on Jul. 16, 2021.

(51) Int. Cl.
*H05K 7/20* (2006.01)
*B60L 53/22* (2019.01)

(52) U.S. Cl.
CPC .......... *H05K 7/20254* (2013.01); *B60L 53/22* (2019.02); *H05K 7/20927* (2013.01); *B60L 2210/10* (2013.01)

(58) Field of Classification Search
CPC .......... H05K 7/20254; H05K 7/20927; H05K 7/20236; H05K 7/20; H05K 7/2039; B60L 53/22; B60L 2210/10; Y02T 10/70
See application file for complete search history.

(56) References Cited

U.S. PATENT DOCUMENTS

| | | | |
|---|---|---|---|
| 7,361,844 B2 * | 4/2008 | Vinciarelli | H05K 7/1092 29/830 |
| 8,953,335 B2 * | 2/2015 | Abe | H05K 7/209 361/728 |
| 9,066,453 B2 | 6/2015 | Wagner et al. | |
| 10,135,355 B2 | 11/2018 | Doo et al. | |
| 10,912,231 B1 | 2/2021 | Chen et al. | |
| 2004/0100778 A1 | 5/2004 | Vinciarelli et al. | |
| 2011/0248389 A1 | 10/2011 | Yorita et al. | |
| 2012/0162847 A1 | 6/2012 | Suzuki et al. | |
| 2013/0077255 A1 | 3/2013 | Abe et al. | |
| 2013/0128643 A1 | 5/2013 | Shinohara et al. | |

(Continued)

FOREIGN PATENT DOCUMENTS

DE 102015208968 A1 11/2015
JP 2013247218 A 12/2013

OTHER PUBLICATIONS

Extended International Search Report dated Mar. 13, 2023.

*Primary Examiner* — Adam B Dravininkas
(74) *Attorney, Agent, or Firm* — Enable IP P.C.

(57) ABSTRACT

An energy management unit (EMU) is disclosed. The EMU includes a cold plate sandwiched between a first printed circuit board (PCB) and a second PCB, the cold plate including one or more magnetics. The cold plate cools both the first PCB and the second PCB.

13 Claims, 6 Drawing Sheets

(56) References Cited

U.S. PATENT DOCUMENTS

| | | | |
|---|---|---|---|
| 2013/0235527 A1* | 9/2013 | Wagner | H05K 1/0203 |
| | | | 29/832 |
| 2014/0126154 A1 | 5/2014 | Higuchi et al. | |
| 2014/0197532 A1 | 7/2014 | Ide et al. | |
| 2015/0334874 A1 | 11/2015 | Rai et al. | |
| 2017/0127540 A1* | 5/2017 | You | H05K 9/0007 |
| 2018/0279508 A1* | 9/2018 | Roan | H05K 7/20254 |
| 2019/0252971 A1* | 8/2019 | Kim | H02M 1/32 |
| 2020/0282853 A1 | 9/2020 | Paryani et al. | |

\* cited by examiner

COLD PLATE FOR POWER ELECTRONIC SYSTEMS

CROSS REFERENCE TO RELATED APPLICATIONS

The present application claims the benefit of U.S. application Ser. Nos. 18/143,973 and 17/864,865; filed on May 5, 2023 and Jul. 14, 2022, respectively, and Provisional Application No. 63/222,802, filed on Jul. 16, 2021, the entirety of which is hereby incorporated by reference.

FIELD

This relates to the On-Board Charger (OBC) and DC-DC converter of an electric vehicle, and in particular, the magnetics mechanical and thermal interface, for a power electronics sub-assembly.

BACKGROUND

Typically, in automotive applications, the power magnetics are either air cooled or one surface is directly coupled to a liquid cooled cold plate. Power electronic magnetics like these are over-sized because of the heat-sinking flux path is one dimensional. In addition, typical magnetics require complicated solder connections to a sub-assembly that includes blade connectors or is directly soldered to a board.

High power and high density power supplies typically contain a cold plate of which the power silicon and power magnetics are both mounted to. After the power supply is assembled, access to the printed circuit board (PCB), or the ability to remove the PCB for end of line testing is difficult or in some cases not possible at all. This is because the switching silicon devices are typically bolted to the cold plate (directly, or through the PCB mounting bolts), while the magnetics are potted into the cold plate with a thermally conductive material, while both components are directly soldered to the PCB.

SUMMARY

One aspect of the present disclosure relates to a shared cold plate manifold, cooling two power electronic PCBs on each side, for example, a DC-DC on one side and an OBC on the other side that reduces parts, costs, and size of a power electronics assembly.

A second aspect of the disclosure relates to a cold-plate manifold that allows low pressure and high flow coolant to pass through, allowing the energy management unit (EMU) to be packaged within the battery cooling loop and the battery pack enclosure, eliminating bulky connectors and enclosures, reducing weight, space, and cost, while improving reliability.

A third aspect of the disclosure relates to a cold-plate manifold that encompasses magnetic elements and reliably cools and seals multiple (e.g., six) magnetic surfaces, allowing superior cooling and a further down-sizing of energy storage or transfer devices.

A fourth aspect of the disclosure relates to magnetic assemblies that include a threaded interface, easing assembly and simultaneously allowing a low impedance contact between the magnetics and the PCB, while at the same time providing a robust mechanical connection against vibration and reacting the compression pressure of thermal interface materials locally to the magnetic screw. The magnetic screw terminals also simultaneously serve as the standoffs for the PCB.

A fifth aspect of the disclosure relates to a process to build magnetics with a threaded interface.

DETAILED DESCRIPTION

In the following description of preferred embodiments, reference is made to the accompanying drawings which form a part hereof, and in which it is shown by way of illustration specific embodiments, which can be practiced. It is to be understood that other embodiments can be used and structural changes can be made without departing from the scope of the embodiments of this disclosure.

Figure 1:
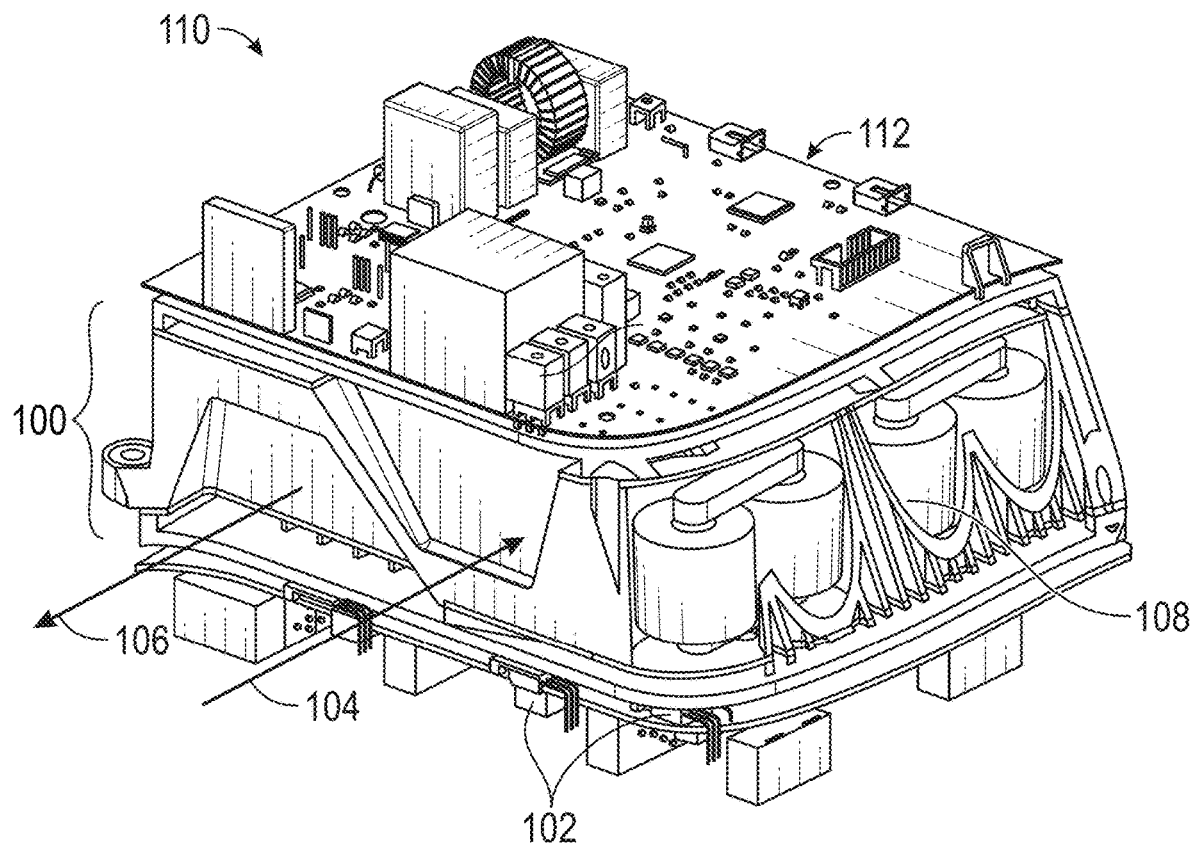
FIG. 1 provides a perspective view of an exemplary energy management unit, according to an embodiment of the disclosure.

FIG. 1 illustrates an exemplary EMU 110, according to an embodiment of the disclosure. The EMU 110 includes a shared cold plate manifold ("cold plate") 100 capable of cooling two power electronic PCBs on each side, for example, a DC-DC PCB 112 on one side and an OBC 102 on the other side. By making the cold plate 100 multi-layered, the footprints of the magnetics 108 can overlap with the footprints of the power silicon and other PCB components 102. This is accomplished by layering the cold plate 100 into a multi-layer assembly as illustrated in FIG. 2.

Figure 2:
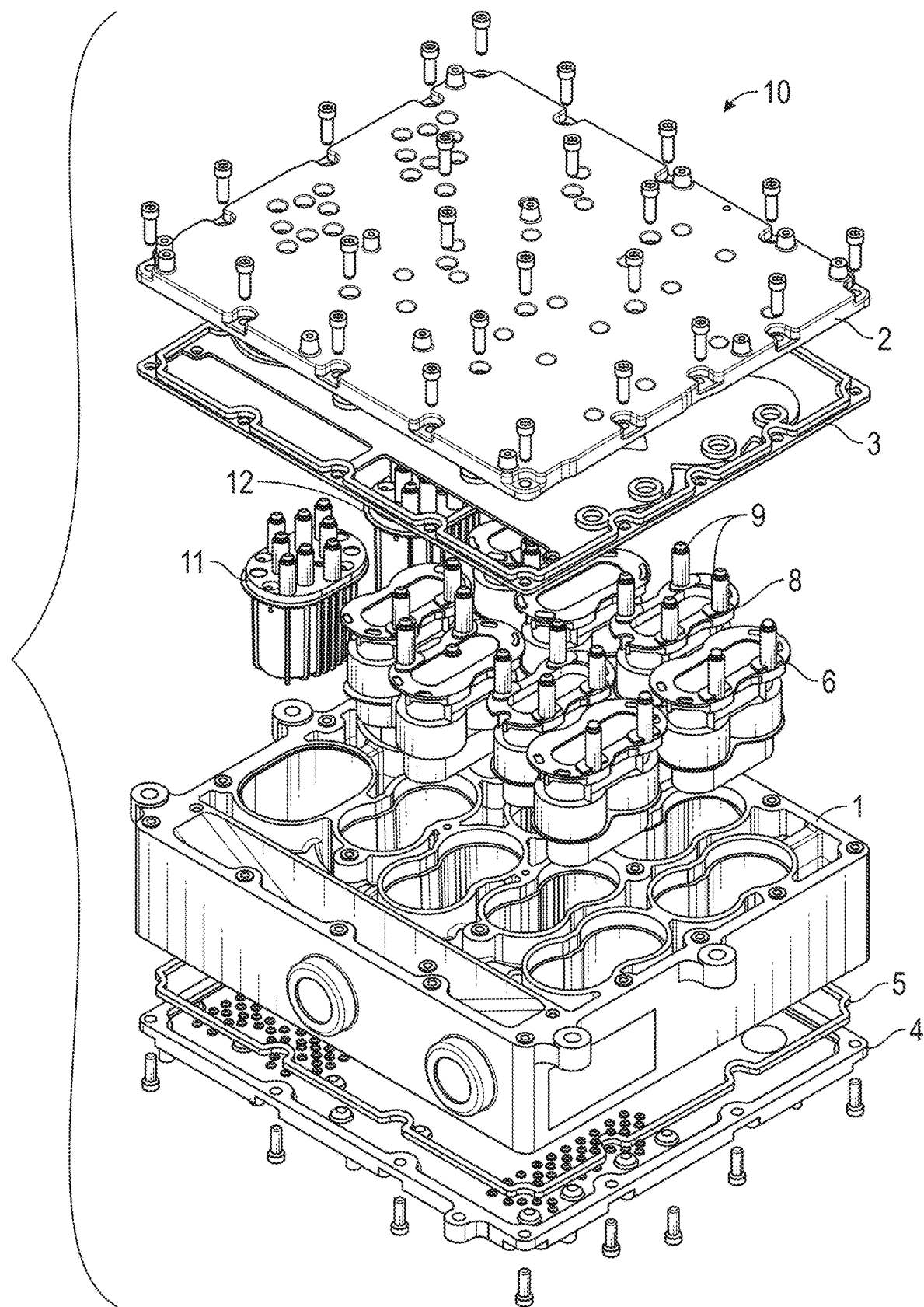
FIG. 2 provides an exploded view of an exemplary cooling manifold, according to an embodiment of the disclosure.

As illustrated in FIG. 2, the two outer layers 4, 2 of the multi-layered assembly 10 contain the end lid-manifolds of which power silicon devices are mounted to. The next two inner pieces 3, 5 on both sides are sealing gaskets. In the illustrated embodiment, sealing gasket 5 can be a simple O-ring while sealing gasket 3 can be a gasket plate that has asymmetrical sealing surfaces on both sides that assists in sealing around the magnetic leads 9 to the outside while allowing coolant to flow over the magnetics, around the leads. It should be understood that other types of sealing gaskets can be used depending on the sealing requirements.

The inner side of gasket plate 5 seals around the top side of the magnetic pockets of cold block (or center block) 1, while the outer side seals around the magnetic leads 9 of end plate manifold 2. The gasket plate 3 allows coolant (not shown in in FIG. 2) to flow over the top of the magnetics 6, 8, while common mode chokes (CMCs) 11, 12 allow coolant to flow directly underneath the bottom of the field effect transistors (FETs) packaged on the outside of the lid manifold 2. This gasket plate 3 routes the coolant into and out of the lid-manifold 2 as it passes through the center plate 1. The last layer of the cold plate is the center block 1. The magnetics 6, 8 and CMCs 11, 12 are potted into the center plate. A higher packaging and power density are realized with this multi-layered cold plate 10.

Referring back to FIG. 1, you will also notice a large inlet 104 and outlet 106 support low pressure and high volume coolant flow. In the embodiments of the present disclosure, magnetics 108 are submerged and cooled with all surfaces, including the perimeter and top and bottom. In addition, a manifold with sealant gaskets, such as the ones illustrated in FIG. 2, allows for high flow rate. The combination of these features allows the magnetics 108 to be downsized.

Using a traditional manufacturing process for a similar sealing gasket plate that is used in automatic transmissions can keep manufacturing costs low. The gaskets 3, 5 as shown in FIG. 2 can keep a high pressure seal of complex cooling channels. The exemplary energy management unit disclosed in these embodiments allows for super high flow rates (up to about 30 LPM) allowing the EMU coolant to be in-line with the battery pack. This gives advantages, in case the EMU is packaged within the battery pack enclosure.

Figure 3:
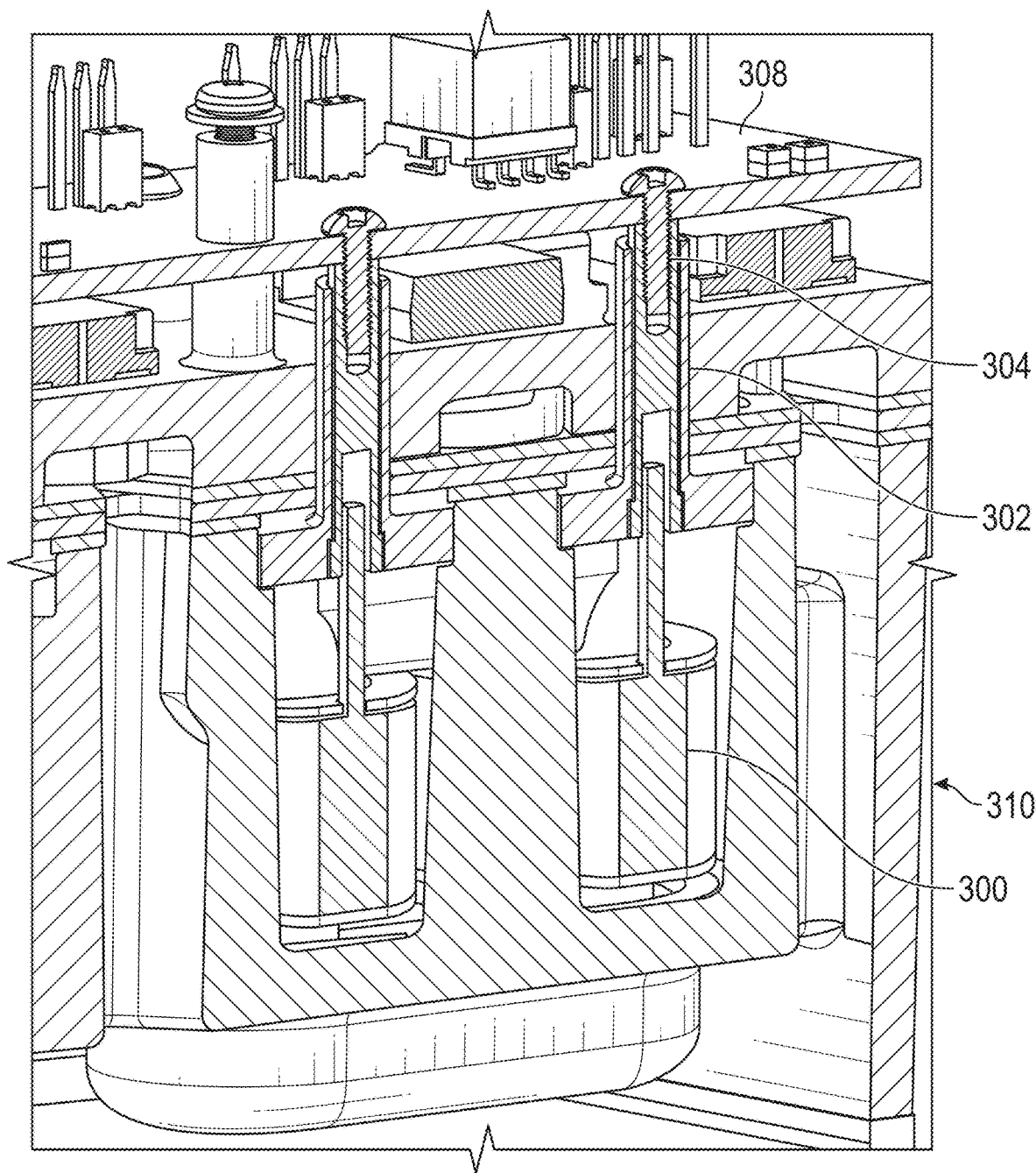
FIG. 3 illustrates the details of an exemplary magnetics interface to PCB, according to an embodiment of the disclosure.

FIG. 3 illustrates the details of an exemplary magnetics interface of the multi-layered assembly 10 to PCB. In this embodiment, to case assembly 310, the magnetic elements are fitted with a threaded interface 302 to allow a screw interface 304 that make both electrical connection between the magnetic element 300 and PCB 308 plus a mechanical connection securing the PCB 308 to the cold block 310. This mechanical interface can replace traditional stand offs and can also provide a local means to reach the compression force of the thermal interface gap pad material used underneath the power silicon devices.

Figure 4A:
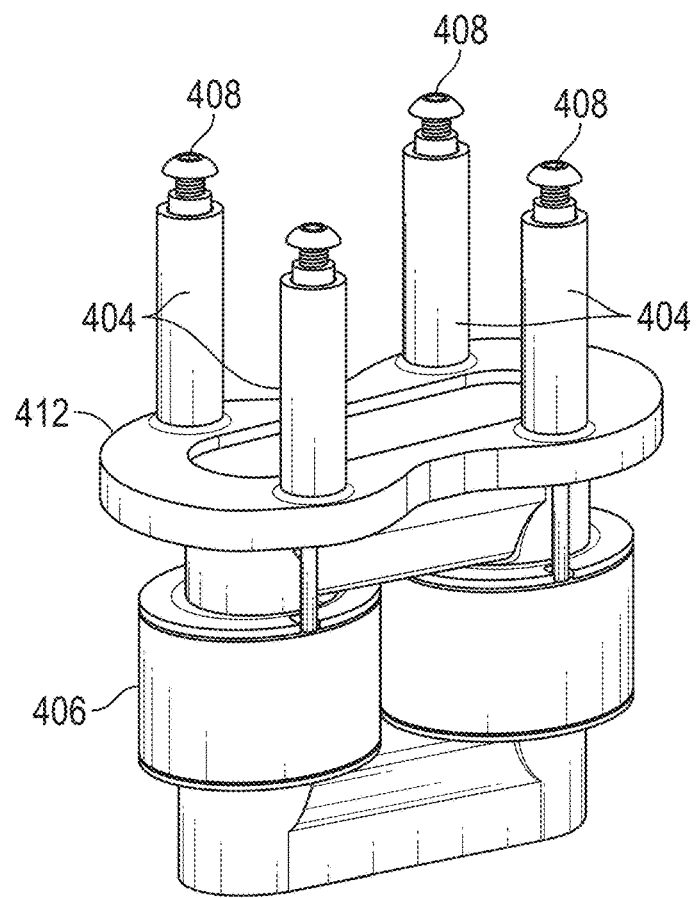
FIGS. 4a and 4b provides a detailed illustration of the functions of each specific feature of the magnet threaded interface to the PCB of FIG. 3, according to an embodiment of the disclosure.
Figure 4B:
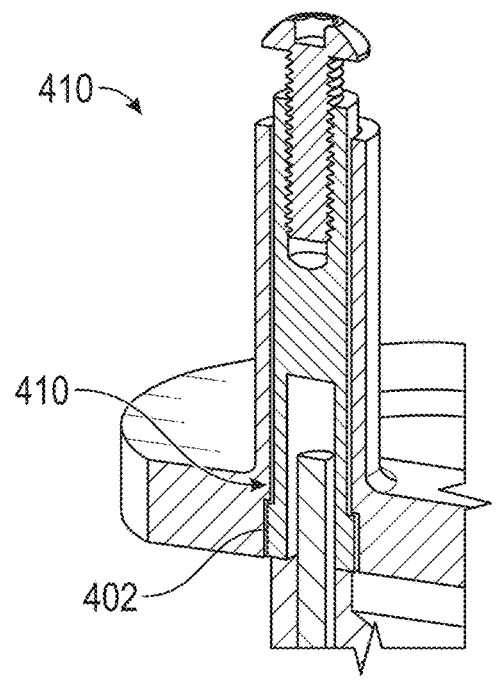

FIGS. 4a and 4b provides a detailed illustration of an exemplary magnet threaded interface (302 in FIG. 3) to PCB of the magnetics. As shown in FIGS. 4a and 4b, to make the PCB easily assembled to and removable (solder-less) from the magnetic terminals 404 of the magnetics, fixturing threaded (screw) terminals 404 are utilized. When the magnetics 406 are embedded (potted) deep into a cold plate, the magnetic terminals 404 can also be utilized to secure down the PCB (not shown in FIG. 4) to the cold plate. When the magnetic screw terminals 402 also serve as the mounting locations for the PCB, the fastening screw 408 for the power silicon can also be removed, and the PCB can apply a preload to thermal interface material 410 underneath the power silicone packages to hold them in place. This is all accomplished with an ABS plastic magnetic end cap 412 as shown in FIG. 4.

The end cap 412 sits on top of the magnetic core 406 and is held into place by the Bottom Plate (2 of FIG. 2). Further, the screw terminal 404 can be plated to have compatible material interface with the PCB. This can include any combination of electroless nickel immersion gold (ENIG), copper, gold or nickel. The magnetic end cap achieves all of these functions by the specific geometry shown in FIG. 4. In particular, in this embodiment, hex screw terminals 404 can transmit screw torque to the plastic end-cap 412 through the hex geometry at the base. The end cap 412 can then transmit the torque to the cold block 406 through the outer geometry of the outer perimeter.

Figure 5:
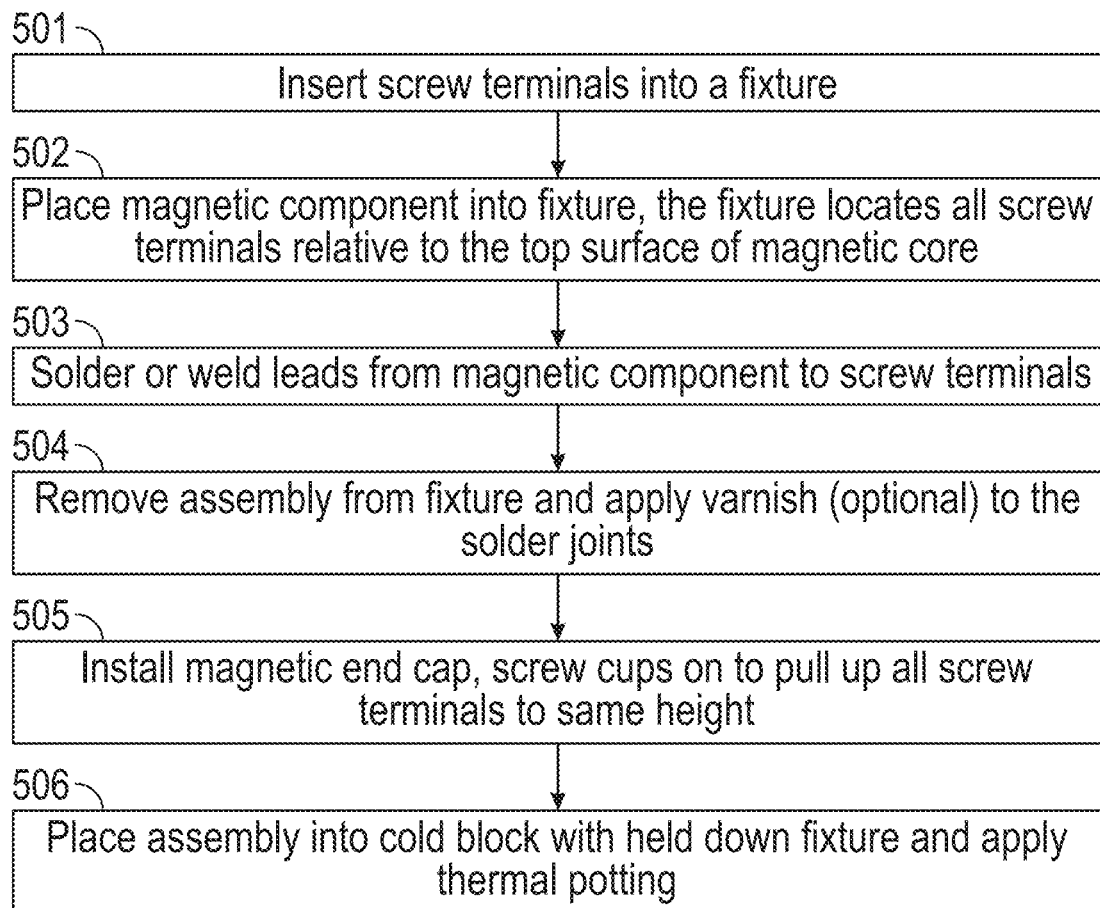
FIG. 5 illustrates the exemplary steps in a thread interface manufacturing process, according to an embodiment of the disclosure.

FIG. 5 is a flow chart illustrating the exemplary steps in a thread interface manufacturing process, according to an embodiment of the disclosure. Specifically, FIG. 5 illustrates the process of assembling the magnetic leads. First, screw terminals are inserted into a fixture (step 501). The magnetic component is then placed into fixture and the fixture locates all screw terminals relative to the top surface of magnetic core (step 502). The leads coming out of the magnetic component are then soldered or welded to the screw terminals (step 503). Then, the assembly is removed from the fixture and varnish is optionally applied to the solder joints (step 504). A magnetic end cap is installed and cups are screwed on to pull up all screw terminals to the same height before the potting process (step 505). Finally, the assembly is placed into the cold block with a hold down fixture and thermal potting is applied (step 506). It should be understood that some of the steps illustrated in FIG. 5 may be performed in parallel or in a different order to the extent that the same result can be achieved.

Figure 6A:
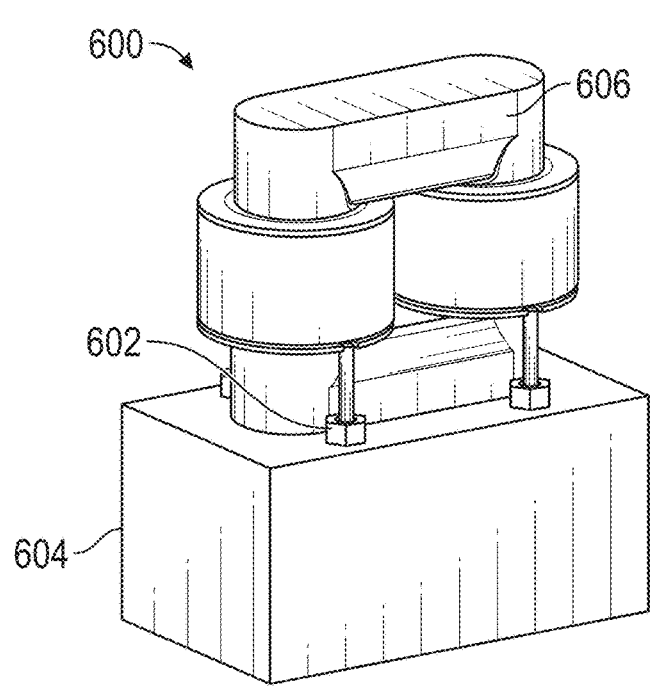
FIGS. 6a-6c illustrate the thread interface at different stages of the manufacturing process of FIG. 5, according to an embodiment of the disclosure.

FIG. 6a illustrates the partially manufactured thread interface 600 in a fixture 604 after steps 501-504 of FIG. 5 are performed. The screw terminals (collectively 602) have been inserted into the fixture 604. Magnetic 606 has been placed into the fixture 604 and bolted down. The fixture 604 locates all screw terminals 602 relative to top surface of the plane. The leads coming out of the magnetic component are soldered or welded to the screw terminals 602.

Figure 6B:
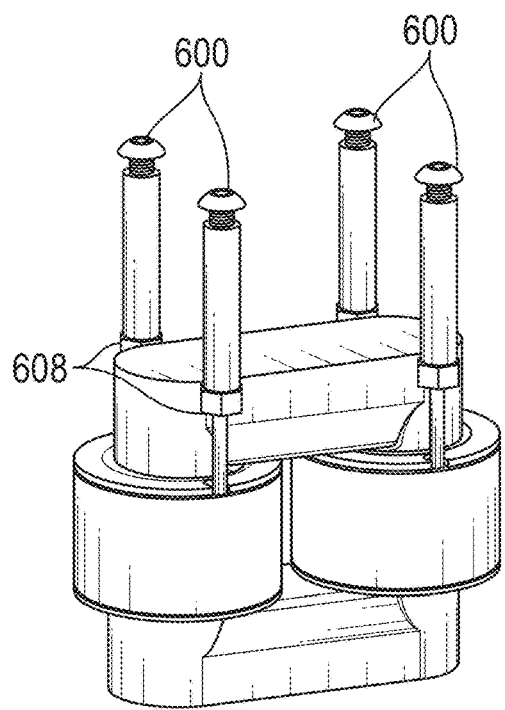

FIG. 6b illustrates further assembled thread interface 600' after step 505 of FIG. 5 is performed. The partially assembled thread interface 600' has been removed from the fixture and varnish has been optionally applied to the solder joints (collectively 608).

Figure 6C:
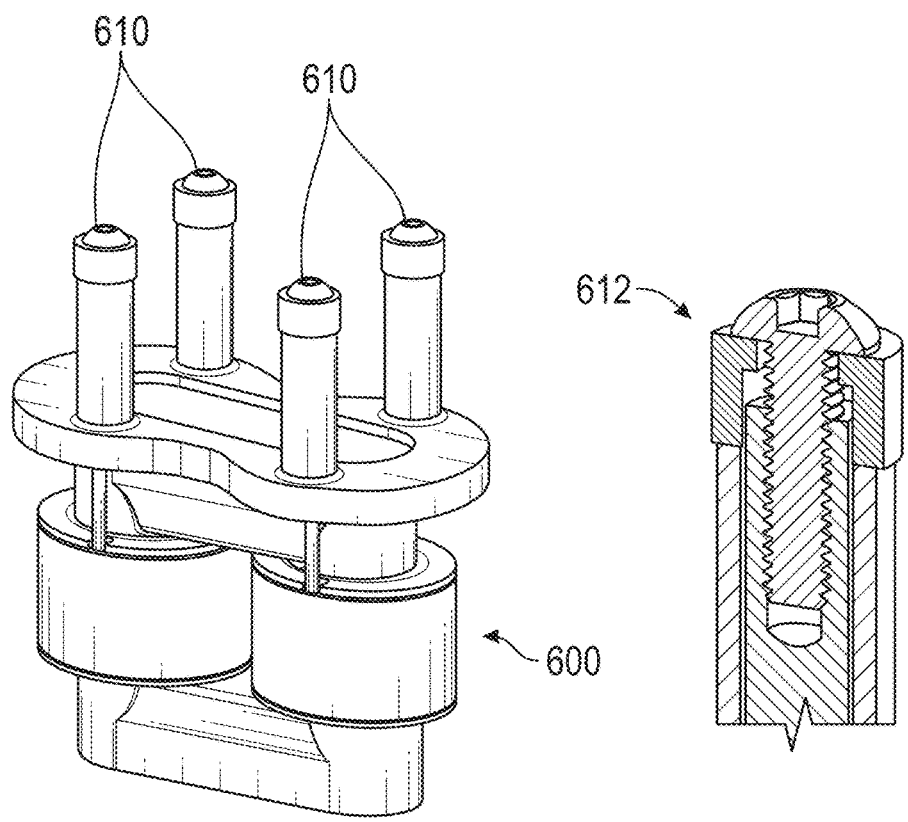

FIG. 6c illustrates the thread interface 600" during step 506 of FIG. 5. A magnetic end cap 610 is installed and cups 612 are screwed on to pull up all screw terminals to the same height before the potting process. The thread interface 600" is then placed into the cold block (not shown in FIG. 6c)

Although embodiments of this disclosure have been fully described with reference to the accompanying drawings, it is to be noted that various changes and modifications will become apparent to those skilled in the art. Such changes and modifications are to be understood as being included within the scope of embodiments of this disclosure as defined by the appended claims.

What is claimed is:

1. An energy management unit (EMU) comprising:
   a cold plate sandwiched between a first printed circuit board (PCB) and a second PCB, the cold plate comprising one or more magnetics;
   wherein the cold plate is configured to cool both the first PCB and the second PCB;
   wherein the cold plate comprises multiple layers including: a top outer layer and a bottom outer layer;
   wherein the cold plate further comprises a first sealing gasket inside of the top outer layer and a second sealing gasket inside of the bottom outer layer;
   wherein the first sealing gasket is configured to seal around a top side of the one or more magnetic pockets and allow coolant to flow over a top of the one or more magnetics; and
   wherein the second sealing gasket is configured to seal around one or more magnetic leads while allowing coolant to flow over the magnetics, around the one or more magnetic leads.

2. The EMU of claim 1, wherein the first PCB comprises a DC-DC PCB and the second PCB comprises an on board charger (OBC) PCB.

3. The EMU of claim 1, wherein the cold plate comprises one or more magnetic pockets configured to hold the one or more magnetics.

4. The EMU of claim 1, wherein the first sealing gasket comprises an O-ring gasket.

5. The EMU of claim 1, wherein the second sealing gasket comprises a gasket plate having asymmetrical sealing surfaces on both sides.

6. The EMU of claim 1, wherein the second sealing gasket is configured to allow coolant to flow over the one or more magnetics and directly underneath a bottom of field effect transistors (FETs) packaged on an outside of the bottom outer layer.

7. The EMU of claim 1, wherein the second sealing gasket is configured to route coolant into and out of the bottom outer layer as the coolant passes through the cold plate.

8. The EMU of claim 1, further comprising a magnetics interface of the cold plate, the magnetics interface comprising:
- a threaded interface comprising both an electrical connection between the one or more magnetics and the first PCB and a mechanical connection securing the first PCB to the cold plate.

9. The EMU of claim 8, further comprising an end cap on top of the one or more magnetics.

10. The EMU of claim 8, wherein the threaded interface comprises a compatible material interface with the first PCB.

11. The EMU of claim 10, wherein the compatible material interface comprises a combination of electroless nickel immersion gold (ENIG), copper, gold, or nickel.

12. A cooling apparatus comprising:
- one or more magnetic pockets configured to hold one or more magnetics;
- a top outer layer and a bottom outer layer, both comprising end lid-manifolds of which power silicon devices are mounted to;
- a first sealing gasket inside of the top outer layer, the first sealing gasket configured to seal around a top side of the one or more magnetic pockets and allow coolant to flow over a top of the one or more magnetics; and
- a second sealing gasket inside of the bottom outer layer, the second sealing gasket is configured to seal around one or more magnetic leads while allowing coolant to flow over the magnetics, around the one or more magnetic leads.

13. The cooling apparatus of claim 12 further comprising a magnetics interface comprising:
- a threaded interface comprising both an electrical connection between the one or more magnetics and the first PCB and a mechanical connection securing the first PCB to the cold plate.

* * * * *